(12) United States Patent
Nadarajah et al.

(10) Patent No.: US 7,002,239 B1
(45) Date of Patent: Feb. 21, 2006

(54) LEADLESS LEADFRAME PACKAGING PANEL FEATURING PERIPHERAL DUMMY LEADS

(75) Inventors: Santhiran Nadarajah, Melaka (MY); Sharon Ko Mei Wan, Melaka (MY); Chan Peng Yeen, Melaka (MY)

(73) Assignee: National Semiconductor Corporation, Santa Clara, CA (US)

( * ) Notice: Subject to any disclaimer, the term of this patent is extended or adjusted under 35 U.S.C. 154(b) by 251 days.

(21) Appl. No.: 10/367,584

(22) Filed: Feb. 14, 2003

(51) Int. Cl.
*H01L 23/495* (2006.01)

(52) U.S. Cl. ............... 257/666; 257/676; 257/669; 257/670; 257/674; 438/111; 438/110; 438/123

(58) Field of Classification Search ........ 257/666–677, 257/684, 730; 438/106–127
See application file for complete search history.

(56) References Cited

U.S. PATENT DOCUMENTS

| | | | |
|---|---|---|---|
| 5,424,577 A * | 6/1995 | Suzuki et al. | 257/670 |
| 6,229,200 B1 * | 5/2001 | Mclellan et al. | 257/666 |
| 6,281,568 B1 * | 8/2001 | Glenn et al. | 257/684 |
| 6,400,004 B1 * | 6/2002 | Fan et al. | 257/666 |

* cited by examiner

*Primary Examiner*—Luan Thai
(74) *Attorney, Agent, or Firm*—Beyer Weaver & Thomas, LLP

(57) ABSTRACT

Methods and apparatuses for providing leadless leadframes with dummy contact leads are disclosed. A leadframe is described that includes an enclosed frame having two lengthwise portions and two widthwise portions. The leadframe also includes a device area array with dummy contact leads formed on the peripheral edges of the device area array. Furthermore, dummy contact leads are positioned along a tie bar such that they are directly opposite corresponding contact leads. By cutting along the tie bar, dummy contact leads are separated from the device area array.

21 Claims, 5 Drawing Sheets

LEADLESS LEADFRAME PACKAGING PANEL FEATURING PERIPHERAL DUMMY LEADS

FIELD OF THE INVENTION

The present invention relates generally to leadless leadframe panels and, more specifically, to dummy leads formed along the periphery of semiconductor device area arrays within leadless leadframe panels for improving the production yield of leadless leadframe packages.

BACKGROUND

A leadless leadframe package (LLP) is a relatively new integrated circuit package design that contemplates the use of a conductive (typically copper) leadframe type substrate structure in the formation of a chip scale package (CSP). As illustrated in FIGS. 1A–1C, in typical leadless leadframe packages, a copper leadless leadframe panel 100 is patterned (typically by stamping or etching) to define a plurality of device areas 102, which form semiconductor device area arrays 101. One of semiconductor device area arrays 101 is designated with a dashed line in FIGS. 1A and 1B. A device area 102 is designated with a smaller dashed line in FIG. 1B and shown in an enlarged and isolated view in FIG. 1C. Each device area 102 contains the following chip substrate features: a die attach pad 104, a plurality of contacts 106 disposed adjacent to their associated die attach pad 104, and very fine tie bars 108 used to support die attach pads 104 and contacts 106.

During assembly, dice are attached to respective die attach pads 104 and conventional wire bonding is used to electrically couple bond pads on each die to associated contacts 106 on leadframe panel 100. After the wire bonding, a plastic cap is molded over the top surface of each device area array 101. The dice are then singulated into leadless leadframe packaged devices and tested. The conventional sawing techniques used to singulate the packaged leadframe utilizes a saw blade that cuts along and obliterates each of the tie bars. Therefore, after singulation, the only materials holding contacts 106 and die attach pads 104 in place is the molding material. The resulting packaged device can then be surface mounted on a printed circuit board or other substrate using conventional techniques.

Although leadless leadframe packaging has proven to be a cost effective packaging arrangement, there are continuing efforts to further reduce the costs associated with packaging. One persistent issue in packaging generally is the need and desire to provide a leadless leadframe panel that allows for consistent and efficient wire-bonding throughout the leadless leadframe panel. Currently, different pressures are applied to a wire-bonding mechanism to wire-bond semiconductor dice to contacts 106 depending upon the location of specific contacts 106 within each device area array 101. Specifically, larger amounts of pressure are required to attach wires to contacts 106 that are located in the interior regions of device area arrays 101 relative to contacts 106 located on the peripheral edges of arrays 101. This is because contacts 106 along peripheral edges of arrays 101 are firmly supported by relatively rigid lengthwise rails 112 and widthwise rails 114. The firm support provided by rails 112 and 114 allows these peripheral contacts to remain relatively stiff during wire-bonding processes and therefore allows for lesser wire-bonding forces to effectively attach wires to the contacts. On the other hand, the interior contacts tend to flex during wire-bonding processes because they are not firmly supported by either lengthwise rails 112 or widthwise rails 114. Therefore, greater pressure is required for effective wire bonding. Since the wire-bonding forces vary, the wire-bonding process is not optimized and will generally result in lifted or chopped welds causing semiconductor package failures; hence, production yields are reduced.

Another issue is the need for a leadless leadframe panel that is securely attached to the molding material that is eventually molded over each of device area arrays 101. Specifically, secure attachment about the peripheral edges of device area arrays 101 would tend to reduce the amount of chipping of the molding material around the corners of each device area array 101 that occurs during singulation. Chipping typically occurs because the rotating saw blade used to singulate device area arrays 101 into individual semiconductor device packages causes vibration of the peripheral edges of the molding material and panel 100. Therefore the saw blade tends to erratically cut through and chip the molding material panel at the corners of device area arrays 101 since the corners of the molding material are not firmly attached to panel 100. In addition, chipping typically occurs when the rotating saw blade cuts perpendicularly into lengthwise rails 112 and widthwise rails 114 because vibrations from the abrupt encounter by the saw blade with the rigid rails are transferred to the corners of the semiconductor device packages positioned in the immediate vicinity. Consequently, corner chipping occurs and may lead to functional failures of the semiconductor device package. Again, a reduction of production yields would result.

There is also the need to provide a leadless leadframe panel that reduces the amount of uneven wear on the saw blades used for singulation. Specifically, a saw blade wears unevenly when cutting along the periphery of device area arrays 101 in order to singulate the semiconductor device packages from therein. As can be seen, lengthwise rails 112 and widthwise rails 114 substantially support the spaced apart contacts 106 that are positioned along the periphery of device area arrays 101. However, as a saw blade cuts along the periphery of device area arrays 101, the blade encounters portions where there is a solid rail on one side and a gap of open area that may be filled by molding material on the other side. In addition, the blade also encounters portions where there is a solid rail on one side and a contact 106 on the other side. Alternatively, the blade may encounter portions where there is molding material on both sides. Therefore, the two sides of a saw blade wear unevenly when cutting along the periphery of device area arrays 101. This in turn may cause damage to the semiconductor device package being cut. Furthermore, subsequent cuts with an uneven blade may cause damage to subsequent singulated semiconductor device packages.

In view of the foregoing, simple, low cost methods and apparatuses for improving the production yield of leadless leadframe packages would be desirable.

SUMMARY

To achieve the foregoing and other objects of the present invention, methods and apparatuses for providing leadless leadframes with dummy leads are disclosed. In one aspect, a leadframe is described in which the leadframe includes an enclosed frame having two lengthwise portions and two widthwise portions. The leadframe also includes a pair of lengthwise tie bars that extend along an inner edge of a respective lengthwise portion of the frame. Each of the lengthwise tie bars have an inner array of contact leads extending towards an inner region of the frame and an outer array of contact leads extending in an opposite direction from the inner array of contact leads. The outer array of contact leads is adjacent to a lengthwise portion of the frame.

In some embodiments, the leadframe also includes a pair of widthwise tie bars that extend along an inner edge of a respective widthwise portion of the frame. Each of the widthwise tie bars having an inner array of contact leads extending towards an inner region of the frame and an outer array of contact leads extending in an opposite direction from the inner array of contact leads. The outer array of contact leads is adjacent to a widthwise portion of the frame. In other embodiments, the leadframe also includes a plurality of internal widthwise strips that extend between the two lengthwise portions and an internal tie bar that extends along each inner internal widthwise strip. Contact leads extend off of opposing edges of each internal tie bar.

In another aspect of the invention, a method for manufacturing semiconductor device packages is described. The method includes providing an electrically conductive leadframe with an enclosed frame having two lengthwise portions, two widthwise portions, and a pair of lengthwise tie bars. Each lengthwise tie bar extending along an inner edge of a respective lengthwise portion of the frame where each of the lengthwise tie bars having an inner array of contact leads extending towards an inner region of the frame and an outer array of contact leads extending in an opposite direction from the inner array of contact leads. The outer array of contact leads is adjacent to a lengthwise portion of the frame. The method also includes sawing along each of the lengthwise tie bars such that the inner array of contact leads are separated from the outer array of contact leads.

In yet another aspect of the invention, a leadless leadframe for use in semiconductor packaging is described. The leadless leadframe includes a conductive sheet of material having a two dimensional array of overlapping device areas defined thereon. The array defined by a plurality of lengthwise and widthwise outer edges. The array also includes lengthwise tie bars that extend adjacent to each of the lengthwise outer edges. Each lengthwise tie bar having opposing edges where contact leads extend off each of the opposing edges.

BRIEF DESCRIPTION OF THE DRAWINGS

The invention, together with further advantages thereof, may best be understood by reference to the following description taken in conjunction with the accompanying drawings in which:

FIG. 5C illustrates a perspective view of a semiconductor device package that is manufactured by applying either a leadless leadframe panel of FIG. 2A or FIG. 3A.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

Figure 1A:
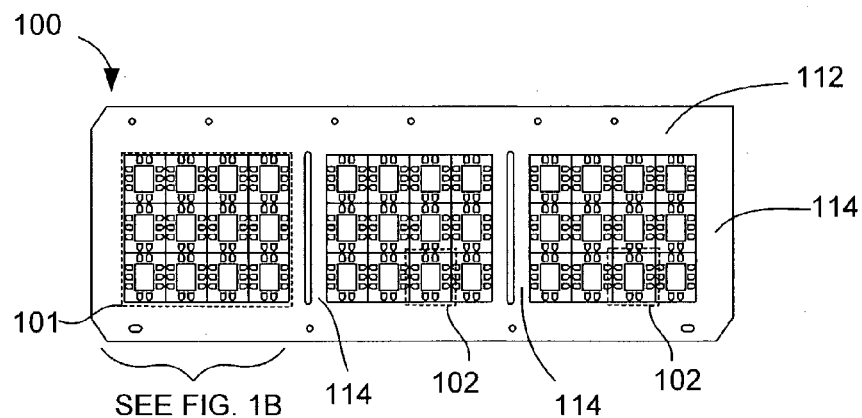
FIG. 1A is a diagrammatic top plan view of a conventional leadframe panel suitable for use in forming leadless leadframe packages.
Figure 1B:
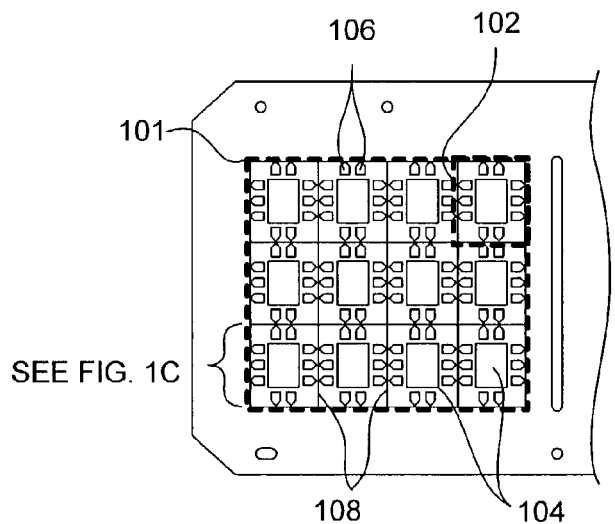
FIG. 1B is an enlarged diagrammatic plan view of one end of the leadframe panel of FIG. 1A, illustrating an array of device areas.
Figure 1C:
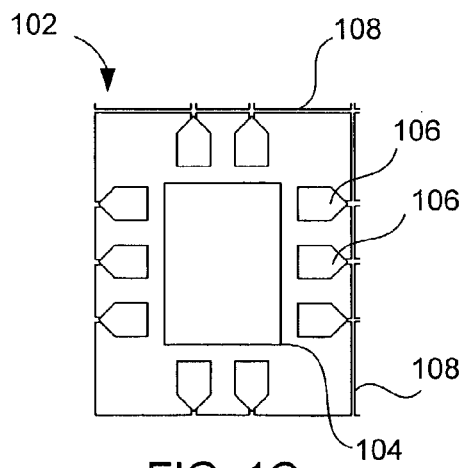
FIG. 1C is a further enlarged plan view of a single device area of FIG. 1B.
Figure 2A:
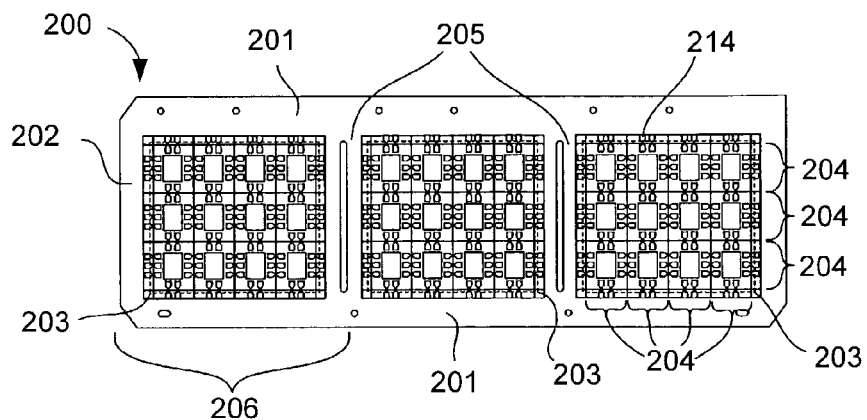
FIG. 2A illustrates a top plan view of a leadless leadframe panel according to one embodiment of the present invention.
Figure 2B:
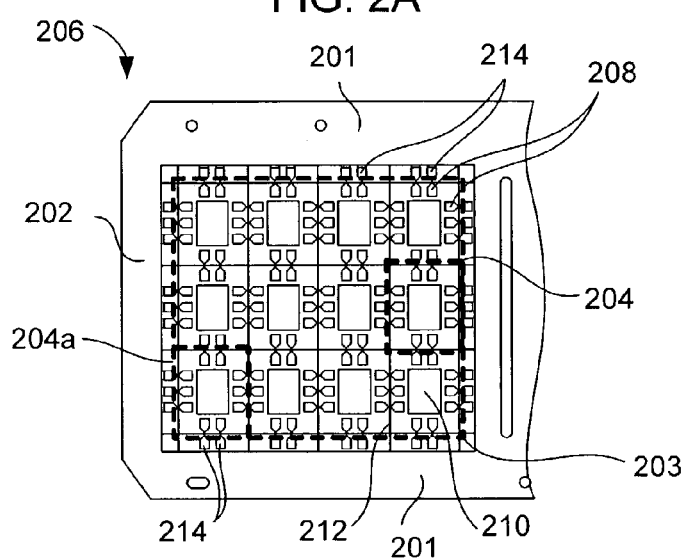
FIG. 2B illustrates an enlarged plan view of a device area array at one end of the leadframe panel of FIG. 2A.
Figure 2C:
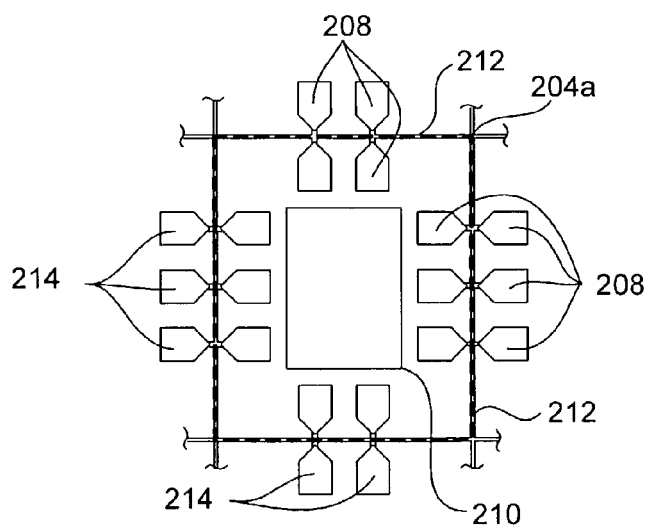
FIG. 2C illustrates an enlarged plan view of a single device area of FIG. 2B together with respective dummy contact leads and electrically contact leads of an adjacent device area.

FIG. 2A–2C illustrates a leadless leadframe panel 200 according to one embodiment of the present invention. First, FIG. 2A illustrates a top plan view of leadless leadframe panel 200, which is typically a flat metal substrate having lengthwise portions 201, widthwise portions 202, and three separate device area arrays 203 separated by internal widthwise strips 205. Each device area array 203 includes suspended device areas 204 that are arranged in rows and columns. Surrounding device area arrays 203 are dummy contact leads 214 that are positioned just outside and along the periphery of device area arrays 203. Next, FIG. 2B illustrates an enlarged plan view of a device area array 203 at one end 206 of leadframe panel 200 of FIG. 2A. Each device area 204 contains a set of electrical contact leads 208 that are set around the perimeter of a rectangular die attach pad 210. Dummy contact leads 214 are typically positioned directly opposite corresponding electrical contact leads 208 where a common axis such as a tie bar 212 is shared. In a specific embodiment, dummy contact leads 214 are identical to the corresponding electrical contact leads 208. Each of the die attach pads 210, dummy contact leads 214, and electrical contact leads 208 are spaced apart from each other and are suspended from panel 200 by their connection to tie bars 212. Tie bars 212 run vertically and horizontally across each of device area arrays 203 in equally spaced intervals. The shape and size of electrical contact leads 208 may vary depending upon the specific design of panel 200. For instance, contact leads 208 may be elongated and flat, however, contact leads 208 may just as well be round and flat (or any other shape). Finally, FIG. 2C illustrates an enlarged plan view of device area 204a of FIG. 2B together with respective dummy contact leads 214 and electrical contact leads 208 of adjacent device areas 204. Dummy leads 214 provide counterbalancing structures with respect to contact leads 208 on the lower and left sides of device area 204a. In this configuration, all of contact leads 208 in device area 204a are similarly counterbalanced by either a dummy lead 214 or a contact lead 208 of an adjacent device area 204. Since all of contact leads 208 of device area 204 are counterbalanced in similar manners, a wirebonding machine can attach wires to each of contact leads 208 using approximately the same amount of pressure. This of course simplifies and optimizes the wire-bonding process.

According to another embodiment, leadless leadframe 200 may have device areas 204 with more corresponding electrical contact leads 208 than other device areas 204 within the same device area array 203. Some device areas 204 may not even have a corresponding die attach pad 210. Furthermore, a device area array 203 may just have one device area 204 or have a multiple of different device areas 204.

Figure 3A:
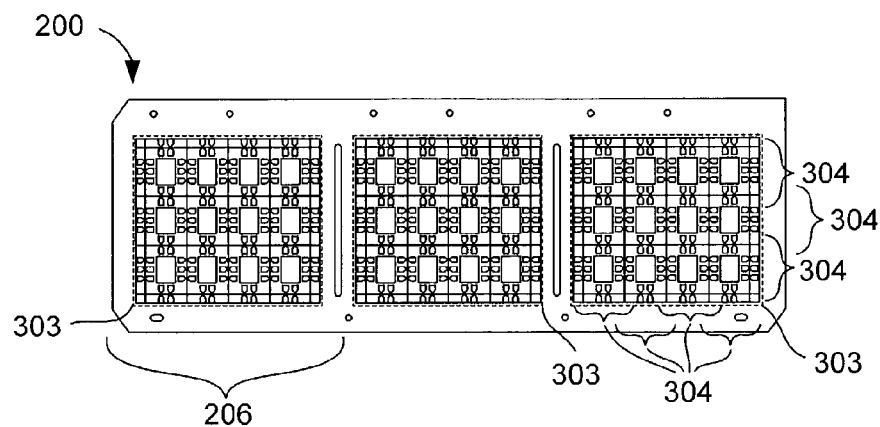
FIG. 3A illustrates a top plan view of a leadless leadframe panel wherein the accompanying description uses a different terminology to describe the present invention.
Figure 3B:
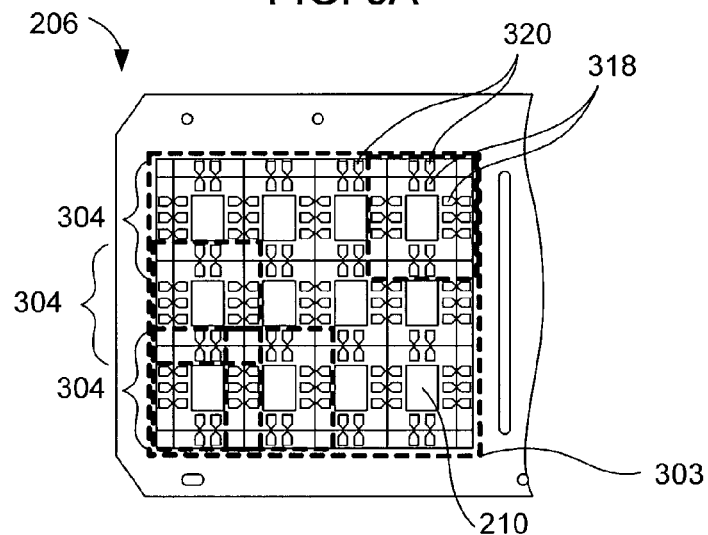
FIG. 3B illustrates an enlarged plan view of a device area array at one end of the leadframe panel of FIG. 3A.
Figure 3C:
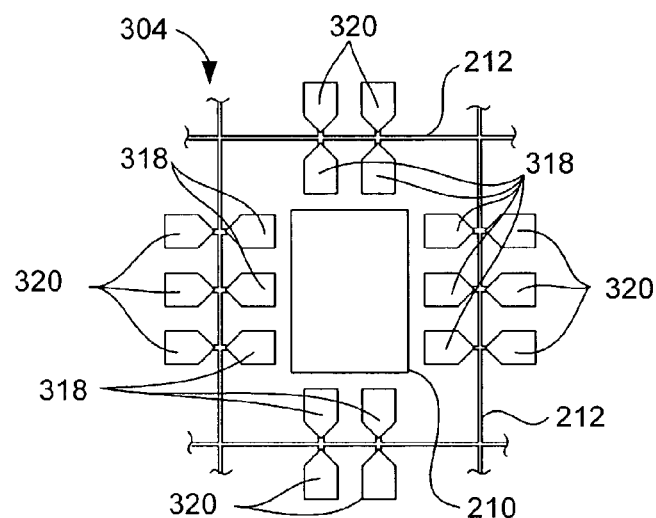
FIG. 3C illustrates an enlarged plan view of a single overlapping device area with an inner set and an outer set of electrical contact leads of FIG. 3B.

FIG. 3A–3C illustrates leadless leadframe panel 200 again while the following descriptive text uses different terminology to describe the present invention. First, FIG. 3A illustrates a top plan view of leadless leadframe panel 200 having three separate device area arrays 303. Each device area arrays 303 include suspended overlapping device areas 304 that are arranged in rows and columns. Next, FIG. 3B illustrates an enlarged plan view of device area array 303 at one end 206 of leadframe panel 200 of FIG. 3A. Each overlapping device area 304 contains an inner set 318 and an outer set 320 of electrical contact leads that are positioned around the perimeter of a corresponding rectangular die attach pad 210 (See FIG. 3C). Since outer set 320 of electrical contact leads of one overlapping device area 304 may overlap an adjacent overlapping device area 304 and may in fact correspond to inner set 318 of electrical contact leads of adjacent overlapping device area 304, a plurality of overlapping device areas 304 results. To illustrate this, some overlapping device areas 304 are shown with dotted lines in FIG. 3B. According to a preferred embodiment, outer set 320 of electrical contact leads are not specifically used with corresponding die attach pad 210 except for providing counterbalancing up until the singulation of the individual semiconductor device packages from panel 200. The electrical contact leads of outer set 320 are typically positioned opposite corresponding electrical contact leads of inner set 318, which is positioned closer to the perimeter of corresponding die attach pad 210. Finally, FIG. 3C illustrates an enlarged plan view of a single overlapping device area 304 with inner set 318 and outer set 320 of electrical contact leads of FIG. 3B. By having outer set 320 of electrical contact leads mirroring a set of corresponding inner set 318 of electrical contact leads on opposing sides of common tie bars 212, each of the corresponding inner set 318 of electrical contact leads can be wire-bonded to a semiconductor die (not shown) using a substantially identical amount of force, thus optimizing the wire bonding process throughout each device area array 303.

An exemplary process of forming the components within device area arrays 203, 303, and dummy contact leads 214 will now be explained. Generally, leadless leadframe panel 200 is initially formed from a flat piece of solid metal material. Die attach pads 210, tie bars 212, electrical contact leads (e.g., 208, 318, 320), and dummy contact leads 214 are formed by chemically etching away the space between these components. Usually, the chemical etching is performed from both sides of leadless leadframe panel 200 such that the chemical etchant dissolves the metal from each side until the space between the components is fully removed. In some embodiments of leadless leadframe panel 200, die attach pad 210 may be half-etched on the opposite surface from its contact surface such that the final packaged semiconductor device has an overall thinner dimension.

Figure 4A:
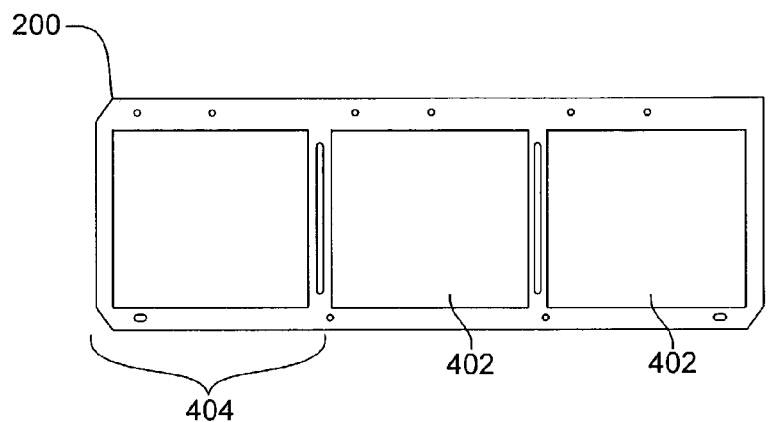
FIG. 4A illustrates a top plan view of a leadless leadframe panel molded according to one embodiment of the present invention.
Figure 4B:
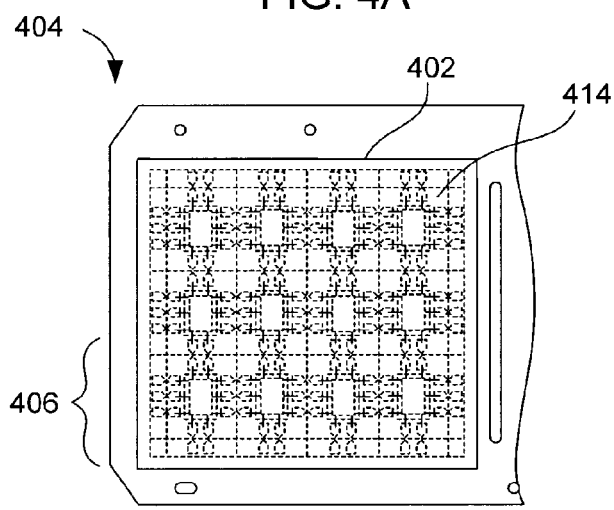
FIG. 4B illustrates an enlarged plan view of one end of the molded leadframe panel of FIG. 4A.
Figure 4C:
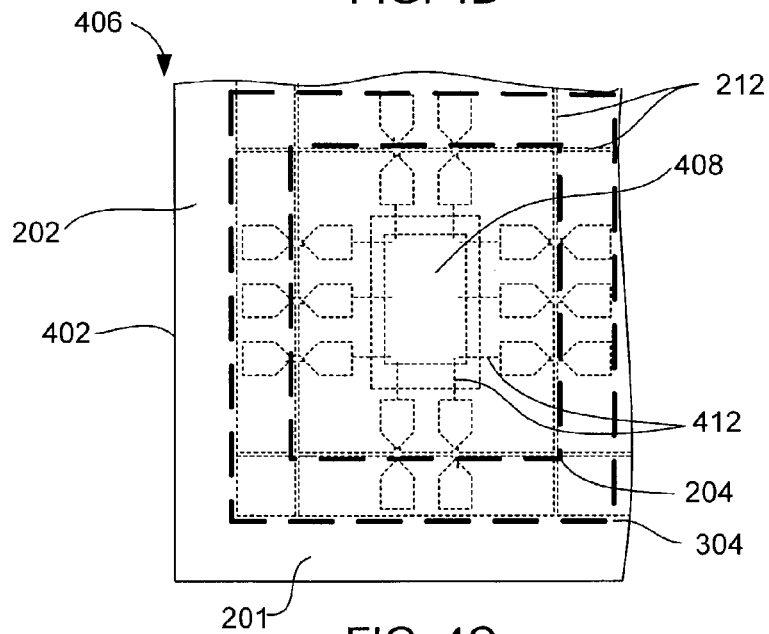
FIG. 4C illustrates an enlarged plan view of a portion of area in FIG. 4B.

FIG. 4A–4C illustrates leadless leadframe panel 200 molded according to one embodiment of the present invention. First, FIG. 4A illustrates a top plan view of the molded leadless leadframe panel 200 that typically comprises of a molded panel 402 (also referred to as a plastic cap) covering a portion of leadless leadframe panel 200. Mold panels 402 would cover device area arrays 303 or 203 and any associated dummy contact leads 214. As illustrated in FIG. 4A, that would include three separate molded panels 402. However, it should be appreciated that a single molded panel 402 or a different number of molded panels 402 can readily be provided. Molded panels 402 may be formed using any conventional molding process including transfer molding and injection molding. Next, FIG. 4B illustrates an enlarged plan view of one end 404 of molded leadframe panel 200 of FIG. 4A, illustrating device areas 204 (or 304) covered by molded panel 402. Device areas 204 are shown thru mold panel 402 with dashed lines. To gain a better perspective of this, FIG. 4C illustrates an enlarged plan view of a portion 406 of area in FIG. 4B. Covered by molded panel 402 is device area 204 (or 304) within rails 201, 202, and 205. Typically, a die 408 is attached to a corresponding die attach pad 210 with bonding wires 412 electrically connecting die 408 to its corresponding electrical contact leads (e.g., 208, 318). Molded panel 402 typically encapsulates die 408 and bonding wires 412 and fills in the gaps between die attach pad 210 and the electrical contact leads (e.g., 208, 318, 320), as well as dummy leads 214, thereby serving to hold the contacts in place. It should be appreciated that during subsequent processing, each device area array 203 is cut along tie bars 212 to separate the individual semiconductor device packages 414 out from molded leadless leadframe panel 200. From then on, the only material holding the electrical contact leads (e.g., 208, 318, 320) in place will be the molding material of molded panel 402.

Figure 5A:
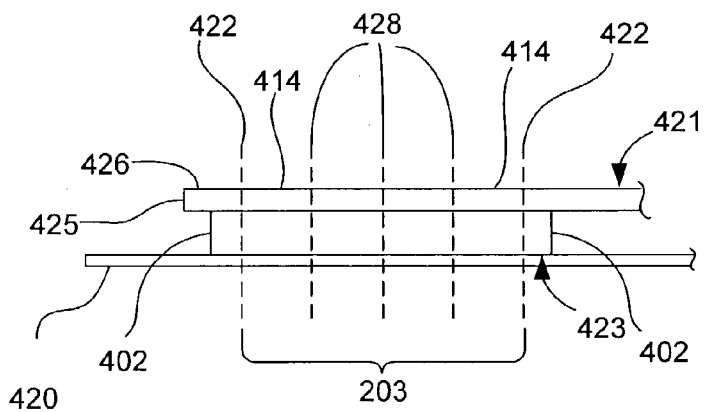
FIG. 5A illustrates a side view of the one end of the molded leadless leadframe panel of FIG. 4B inverted and in preparation for singulation.

The singulation process will now be described. FIG. 5A illustrates a side view of one end 404 of molded leadless leadframe panel 200 of FIG. 4B inverted and in preparation for singulation. As shown, bottom 421 of molded leadless leadframe panel 200 is facing up and an adhesive tape 420 is attached to top surface 423 of molded panel 402. Adhesive tape 420 is used to retain individual semiconductor device packages 414 in place during singulation. Essentially, adhesive tape 420 increases the overall structural integrity of molded leadless leadframe panel 200 so that singulated semiconductor device packages 414 or other components of molded leadless leadframe panel 200 will not inadvertently detach or fracture during the singulation process, particularly when singulating the four outer singulation paths 422 at the peripheral edge portions of molded panel 402.

Figure 5B:
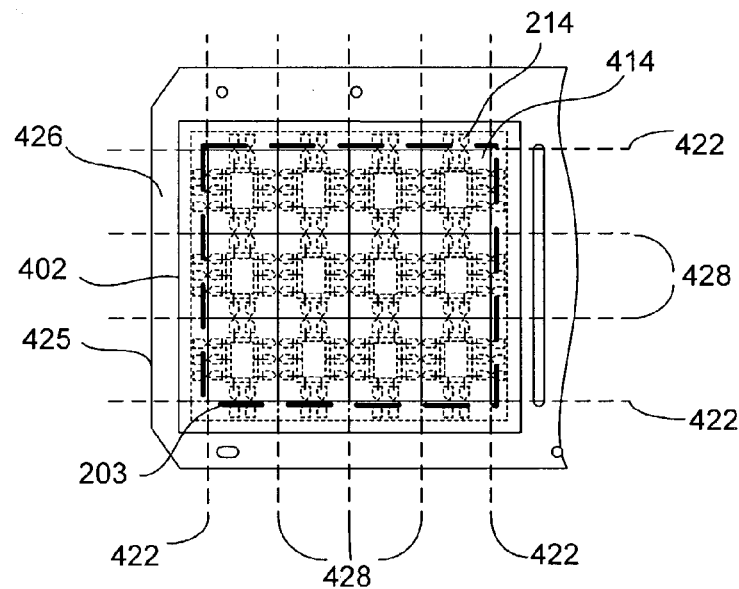
FIG. 5B illustrates a plan view of the one end of the molded leadless leadframe panel of FIG. 4B with superimposed singulation paths.

As can be seen in FIG. 5A and FIG. 5B, the outer perimeter of molded panel 402 extends out past the peripheral edges of device area array 203 and dummy contact leads 214, but does not typically fully extend to perimeter edge 425 of leadless leadframe panel 200. The outer edge regions 426 of leadless leadframe panel 200, hence, substantially overhangs molded panel 402. Furthermore, portions of molded panel 402 that are adhered to these outer leadless leadframe panel edges are relatively small compared to the overhanging outer edge regions 426. Nevertheless, as a rotating saw blade cuts there through during singulation, separation between the singulated outer peripheral edge of molded panel 402 and the singulated outer edge region 426 of leadless leadframe panel 200 will be minimized despite the forces exerted by the blade upon molded panel 402 and leadless leadframe panel 200. This is because by having molded leadless leadframe panel 200, the availability of either dummy contact leads 214 or outer sets 320 of electrical contact leads that are positioned along the periphery of device area array 303 aid in the attachment of the singulated outer edge region 426 to molded panel 402. That is, since molding material is able to get between the gaps separating these dummy contact leads 214 or outer sets 320 of electrical contact leads, a locking effect is produced; hence, locking the singulated outer peripheral edge of molded panel 402 to the singulated outer edge region 426 of leadless leadframe panel 200. This is advantageous since any detached projectiles are not only dangerous, but they can sever wiring, damage the leadless leadframe panel or packaging, and/or cause processing errors or contamination within the manufacturing process. For example, the detached pieces of leadless leadframe panel 200 may cause blade failure, premature wear or blade breakage.

FIG. 5B illustrates a plan view of one end 404 of molded leadless leadframe panel 200 of FIG. 4B with superimposed singulation paths. Outer singulation paths 422 and inner singulation paths 428 are shown. Outer singulation paths 422 define where singulated semiconductor device packages 414 reside. Outer edge regions 426, as shown in FIG. 5B, may include either dummy contact leads 214 or outer sets 320 of electrical contact leads that are positioned along the periphery of device area array 303. Here, portions of outer edge regions 426 are covered by the outer peripheral edge of molded panel 402.

Figure 6:
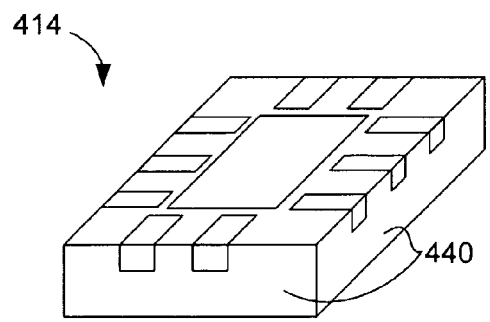

FIG. 6 illustrates a perspective view of semiconductor device package 414 that is manufactured by applying leadless leadframe panel 200 of FIG. 2A or FIG. 3A. During singulation, sides 440 are created where portions of both molded panel 402 and electrical contact leads (e.g., 208, 318) are visible. As can be visualized, intermittent changes in material densities are encountered when sawing with a blade in creating sides 440. That is, as a saw blade cuts along the tie bars (not shown) in singulating the individual semiconductor device packages 414, the sides of a saw blade would substantially encounter areas where there are either portions of molded panel 402 or portions of electrical contact leads (e.g., 208, 318). However, due to the application of leadless leadframe panel 200, the intermittent changes in material densities as encountered by both sides of the saw blade are substantially similar. This is because by using leadless leadframe panel 200 that has either dummy contact leads 214 or adjoining electrical contact leads 208 mirroring a set of corresponding electrical contact leads 208 on an opposing side of common tie bars 212, the sides of the saw blade will encounter substantially mirroring material densities. Likewise, by using leadless leadframe panel 200 that has an outer set 320 of electrical contact leads mirroring a corresponding inner set 318 of electrical contact leads on an opposing side of common tie bars 212, the sides of the saw blade will again encounter substantially mirroring material densities. Therefore, the wearing of the saw blade is substantially even along both sides.

The present invention provides a number of advantages. Besides reducing uneven wear on the saw blade and minimizing the amount of detached projectiles, the present invention has other advantages. By way of example, the methods and apparatuses to provide dummy leads 214 or outer sets 320 of electrical contact leads along the periphery of device area array (e.g., 203, 303) of a leadless leadframe panel 200 minimizes corner chipping of semiconductor device packages 414 that are positioned along the periphery of device area array during singulation. Since these leads are provided, the dice are located further away from the rigid rails (e.g., lengthwise portion 201; widthwise portion 202; internal widthwise strips 205), thereby reducing the amount of stress transferred to the corners of semiconductor device packages 414 when cutting substantially perpendicular with the saw blade into the rails. Hence, the amount of corner chipping is significantly reduced. In fact, according to another embodiment, cutting into the adjacent rails can be substantially eliminated altogether. This is because the semiconductor device packages 414 that are positioned along the periphery of device area array 203 are offset from the rails by either dummy leads 214 or outer sets 320 of electrical contact leads. The present invention allows the ability to quickly and effectively improve production yield in leadless leadframe packages.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. An electrically conductive leadframe for manufacturing semiconductor device packages comprising:
    an enclosed frame having two lengthwise portions and two widthwise portions; and
    a pair of lengthwise tie bars, each lengthwise tie bar extending along an inner edge of a respective lengthwise portion of the frame, each of the lengthwise tie bars having an inner array of contact leads extending towards an inner region of the frame and an outer array of contact leads extending in an opposite direction from the inner array of contact leads, each inner contact lead having a corresponding outer contact lead of substantially the same size and positioned directly opposite the corresponding outer contact lead along the lengthwise tie bars, the outer array of contact leads being adjacent to a lengthwise portion of the frame.

2. An electrically conductive leadframe as recited in claim 1, further comprising:
    a pair of widthwise tie bars, each widthwise tie bar extending along an inner edge of a respective widthwise portion of the frame, each of the widthwise tie bars having an inner array of contact leads extending towards an inner region of the frame and an outer array of contact leads extending in an opposite direction from the inner array of contact leads, the outer array of contact leads being adjacent to a widthwise portion of the frame.

3. An electrically conductive leadframe as recited in claim 2, wherein each contact lead of the inner array of contact leads is positioned along the lengthwise and widthwise tie bars at a point that is directly opposite from a respective contact lead of the outer array of contact leads.

4. An electrically conductive leadframe as recited in claim 2, further comprising:
a mold panel formed over the leadframe such that the mold panel covers the inner and outer array of contact leads of the lengthwise and widthwise tie bars.

5. An electrically conductive leadframe as recited in claim 1, further comprising:
a mold panel formed over the leadframe such that the mold panel covers the inner and outer array of contact leads of the lengthwise tie bars.

6. An electrically conductive leadframe as recited in claim 5, wherein the mold panel interlocks with the inner and outer array of contact leads of the lengthwise tie bars.

7. An electrically conductive leadframe as recited in claim 1, further comprising:
a plurality of internal widthwise strips that extend between the two lengthwise portions; and
an internal tie bar that extends along each inner internal widthwise strip, wherein contact leads extend off of opposing edges of each internal tie bar.

8. An electrically conductive leadframe as recited in claim 7, wherein the contact leads are positioned along the opposing edges at a point that is directly opposite from a respective contact lead.

9. An electrically conductive leadframe as recited in claim 1, further comprising:
at least one die attach pad, wherein the die attach pad is positioned between the inner array of contact leads.

10. An electrically conductive leadframe as recited in claim 9, further comprising:
a semiconductor die positioned over the die attach pad.

11. An electrically conductive leadframe as recited in claim 10, further comprising:
electrical connections between the die and the inner array of contact leads.

12. An electrically conductive leadframe as recited in claim 1, wherein the outer array of contact leads are suspended by the lengthwise tie bars.

13. A leadless leadframe for use in semiconductor packaging, comprising:
a conductive sheet of material having a two dimensional array of overlapping device areas defined thereon, the array defined by a plurality of lengthwise and widthwise outer edges, the array including,
lengthwise tie bars that extend adjacent to each of the lengthwise outer edges, each lengthwise tie bar having opposing edges where contact leads extend off each of the opposing edges, each contact lead having a corresponding contact lead of substantially the same size and positioned directly opposite the corresponding contact lead.

14. A leadless leadframe for use in semiconductor packaging as recited in claim 13, wherein the array further comprises:
widthwise tie bars that extend adjacent to each of the widthwise outer edges, each widthwise tie bar having opposing edges where contact leads extend off each of the opposing edges.

15. A leadless leadframe for use in semiconductor packaging as recited in claim 14, wherein the contact leads are positioned along the opposing edges at a point that is directly opposite from a respective contact lead.

16. A leadless leadframe for use in semiconductor packaging as recited in claim 13, further comprising:
a plurality of integrated circuit dice, each die positioned within an associated device area.

17. A leadless leadframe for use in semiconductor packaging as recited in claim 16, further comprising:
a plurality of electrical connections between each die and a corresponding contact lead.

18. A leadless leadframe for use in semiconductor packaging as recited in claim 13, further comprising:
a mold panel formed over the leadframe such that the mold panel covers the contact leads of the lengthwise tie bars.

19. A leadless leadframe for use in semiconductor packaging as recited in claim 18, wherein the mold panel interlocks with the contact leads of the lengthwise tie bars.

20. A panel of packaged integrated circuit devices comprising:
a leadless leadframe as recited in claim 13;
a plurality of integrated circuit dice, each die being mounted on an associated die attach pad within a corresponding device area;
a multiplicity of interconnecting wires that electrically connect the dice to associated contact leads within their associated device areas; and
at least one protective cap that covers a plurality of the device area thereby encapsulating their associated connectors while leaving at least a portion of a bottom surface area of the associated contact leads exposed to form external electrical contacts.

21. A lead frame panel suitable for use in packaging an array of integrated circuits in leadless leadframe style packaging, the lead frame panel being formed from a conductive sheet, the lead frame panel comprising:
a matrix of tie bars that extend in substantially perpendicular rows and columns to define a two dimensional array of immediately adjacent device areas separated only by the tie bars, each device area being suitable for use in an independent integrated circuit package;
a multiplicity of conductive contacts, the conductive contacts being mechanically carried by the tie bars, wherein each device area has a plurality of associated contacts; and
support rails that carry the tie bars, the tie bars including at least some intermediary tie bars that separate immediately adjacent device areas and a plurality of peripheral tie bars, each peripheral tie bar being positioned between one of the rails and associated device areas; and
a plurality of dummy contacts that are not intended for use in any of the integrated circuit packages, the dummy contacts being suspended by the peripheral tie bars, wherein each dummy contacts is located directly opposite a corresponding contact carried by the peripheral tie bars, and wherein each dummy contacts is identical in shape to a corresponding contact carried by the peripheral tie bars.

* * * * *

UNITED STATES PATENT AND TRADEMARK OFFICE
CERTIFICATE OF CORRECTION

| | |
|---|---|
| PATENT NO. | : 7,002,239 B1 |
| APPLICATION NO. | : 10/367584 |
| DATED | : February 21, 2006 |
| INVENTOR(S) | : Nadarajah et al. |

It is certified that error appears in the above-identified patent and that said Letters Patent is hereby corrected as shown below:

In the Specification:

Column 3, line 66, change "electrically" to --electrical--.

Column 4, line 22, change "FIG. 5C" to --FIG. 6--.

In the Claims:

In line 11 of claim 20 (column 10, line 29) change "device area" to --device areas--.

Signed and Sealed this

Thirtieth Day of January, 2007

JON W. DUDAS
*Director of the United States Patent and Trademark Office*